US009160165B2

(12) United States Patent
Cortigiani et al.

(10) Patent No.: US 9,160,165 B2
(45) Date of Patent: Oct. 13, 2015

(54) SEMICONDUCTOR DEVICE INCLUDING SHORT-CIRCUIT PROTECTION

(71) Applicant: Infineon Technologies AG, Neubiberg (DE)

(72) Inventors: Fabrizio Cortigiani, Padua (IT); Adolfo De Cicco, Padua (IT)

(73) Assignee: INFINEON TECHNOLOGIES AG, Neubiberg (DE)

( * ) Notice: Subject to any disclaimer, the term of this patent is extended or adjusted under 35 U.S.C. 154(b) by 184 days.

(21) Appl. No.: 14/030,182

(22) Filed: Sep. 18, 2013

(65) Prior Publication Data

US 2014/0078629 A1    Mar. 20, 2014

(30) Foreign Application Priority Data

Sep. 20, 2012 (EP) ..................... 12185257

(51) Int. Cl.
*H02H 3/08* (2006.01)
*H02H 9/02* (2006.01)
*H03K 17/082* (2006.01)
*H03K 17/24* (2006.01)

(52) U.S. Cl.
CPC ............. *H02H 9/02* (2013.01); *H03K 17/0822* (2013.01); *H03K 17/24* (2013.01); *H03K 2217/0081* (2013.01)

(58) Field of Classification Search
USPC ....................................... 361/93.1
See application file for complete search history.

(56) References Cited

U.S. PATENT DOCUMENTS

| 5,959,537 | A  | * | 9/1999 | Banting et al. ............. 340/664 |
| 6,985,343 | B2 | * | 1/2006 | Mirowski et al. ........... 361/93.2 |
| 7,554,783 | B2 | * | 6/2009 | Heath et al. ................ 361/93.1 |

* cited by examiner

*Primary Examiner* — Dharti Patel
(74) *Attorney, Agent, or Firm* — SpryIP, LLC

(57) ABSTRACT

A semiconductor device includes a load current path operable to carry a load current from a supply terminal having a supply voltage to an output circuit node. The device further includes a voltage comparator configured to compare the supply voltage with a voltage threshold and to signal a low supply voltage when the supply voltage reaches or falls below the voltage threshold. An over-current detector is configured to compare a load current signal that represents the load current with an over-current threshold and to signal an over-current when the load current signal reaches or exceeds the over-current threshold. Furthermore, the semiconductor device includes a control logic unit that is configured to deactivate the load current flow when an over-current is signalled and to reduce the over-current threshold from a first value to a lower second value as long as the voltage comparator signals a low supply voltage.

20 Claims, 3 Drawing Sheets smart switch 10

SEMICONDUCTOR DEVICE INCLUDING SHORT-CIRCUIT PROTECTION

RELATED APPLICATIONS

This Application claims priority benefit of European Patent Application EP12185257, which was filed on Sep. 20, 2012. The entire contents of the indicated European Patent Application are hereby incorporated herein by reference.

TECHNICAL FIELD

The present invention relates to the field of semiconductor devices and methods for operating such devices, particularly to power semiconductor devices including a fault detection capability for detecting faulty operating states that lead to a rise in temperature such as, for example, short circuits.

BACKGROUND

Semiconductor devices, especially power semiconductor devices such as power semiconductor switches, often include a current and temperature measurement functionality for detecting faulty or undesired modes of operation during which undesirably high currents or temperatures occur. Such faulty or undesired modes of operation may be, inter alia, an over-load, or a short circuit.

Power semiconductor switches capable of detecting over-temperature, over-load, short-circuits, etc. are often referred to as "smart switches". Typically such smart switches include at least one power transistor (e.g. a DMOS high-side switch) and an over-current detection circuit for each power transistor that compares a measured signal that represents the load current flowing through the transistor with a defined threshold value that represent a maximum current. When the load current reaches or exceeds the maximum current, the load current is switched off in order to protect the device.

However, in many applications smart switches have to handle high inrush currents. This may be the case, e.g., when switching on incandescent lamps, electric motors or the like. The inrush currents are typically much higher than the maximum current, yet the high inrush currents are transient and usually do not cause a dangerous over-temperature. However, the over-current protection circuit included in the smart switch needs to distinguish between high inrush currents and over-currents resulting from a short circuit. For this reason the threshold, which determines the maximum current, is set to a higher value (higher than during normal operation) during a start-up phase in which transient inrush currents may occur. This start-up phase is usually defined as a fixed time interval, e.g., 10 ms. When this time interval has elapsed, the threshold, which determines the maximum current, is reset to the lower—nominal—value.

When an over-current is detected (i.e. when an over-current event occurs) the device may be deactivated. That is, the device is latched in an inactive state in which the load current is switched off. However, to avoid a deactivation during the start-up phase the device is re-activated after an over-current event for a defined number of times (e.g. 32 times). That is, the device is finally deactivated (and not re-activated) when the maximum number of over-current events occurs during the start-up phase. After the start-up phase, a single over-current event is sufficient for latching the device in an off-state.

The "switching" between the start-up phase with a high maximum current threshold and the normal operation with a low maximum current threshold is usually implemented digitally with a finite state machine (FSM). A further problem arises when the smart switch is supplied via a long supply line. For example, in automotive applications the supply line may be up to 5 meters long or even longer, resulting in a line resistance of about 100 mΩ and a line inductance of about µH. As a consequence the voltage drop across the supply line may be rather high due to the high inrush currents during the start-up phase. In fact, the voltage drop across the supply line may be high enough to trigger the under-voltage detection. When an under-voltage is detected (i.e. in case of an under-voltage event) the state-machine and thus the counter, which counts the over-current events during the start-up phase, is reset. As a consequence, the over-current event counter will never reach the maximum number as the supply voltage drops and thus the counter is reset every time the switch is closed and the inrush current starts to rise.

The problem to be solved by the present invention is to provide a semiconductor device including an over-current protection which can handle transient voltage drops across the supply line.

SUMMARY

A semiconductor device is described herein. In accordance with a first aspect of the invention the semiconductor device includes a semiconductor chip having a load current path operable to carry—in accordance with an input signal—a load current from a supply terminal having a supply voltage to an output circuit node. The device further includes a voltage comparator that is configured to compare the supply voltage with a voltage threshold and to signal a low supply voltage when the supply voltage reaches or falls below the voltage threshold. An over-current detector is configured to compare a load current signal that represents the load current with an over-current threshold and to signal an over-current when the load current signal reaches or exceeds the over-current threshold. Furthermore, the semiconductor device includes a control logic unit that is configured to deactivate the load current flow when an over-current is signalled and to reduce the over-current threshold from a first value to a lower second value as long as the voltage comparator signals a low supply voltage.

Furthermore, a method for controlling a power semiconductor transistor to activate or deactivate a load current, which passes through the transistor from a supply terminal providing a supply voltage to an output circuit node is described. In accordance with another aspect of the invention the method includes monitoring the supply voltage and signalling a low supply voltage when the supply voltage reaches or falls below a first voltage threshold. It further includes monitoring the load current and signalling an over-current when the load current reaches or exceeds an adjustable over-current threshold. The over-current threshold is reduced from an from an initially higher first value to a lower second value when and as long as a low supply voltage is signalled. The transistor and thus the load current passing through the transistor is at least temporarily deactivated when an over-current is signalled.

BRIEF DESCRIPTION OF THE DRAWINGS

The various embodiments can be better understood with reference to the following drawings and descriptions. The components in the figures are not necessarily to scale, instead emphasis is placed upon illustrating the principles of the invention. Moreover, in the figures, like reference numerals designate corresponding parts. In the drawings.

DETAILED DESCRIPTION

As discussed in the introductory part, high inrush currents may occur after activation of the considered semiconductor device. The semiconductor device may be a, for example, a power transistor (e.g. a DMOS n-channel high-side transistor) that controls the switching state of a lamp. When switching on a cold lamp the inrush currents (generally the load current $i_L$) may be a multiple of the nominal load current. A very short time after switching on the lamp, the load current flowing through the load current path of the transistor (i.e., through the active area of the semiconductor device) will rise above a specific limit (i.e. a pre-defined over-current threshold value) which would be unacceptable for a longer period of time since such high currents might lead to an undesired degradation of the device or even to the thermal destruction of the device.

Figure 1:
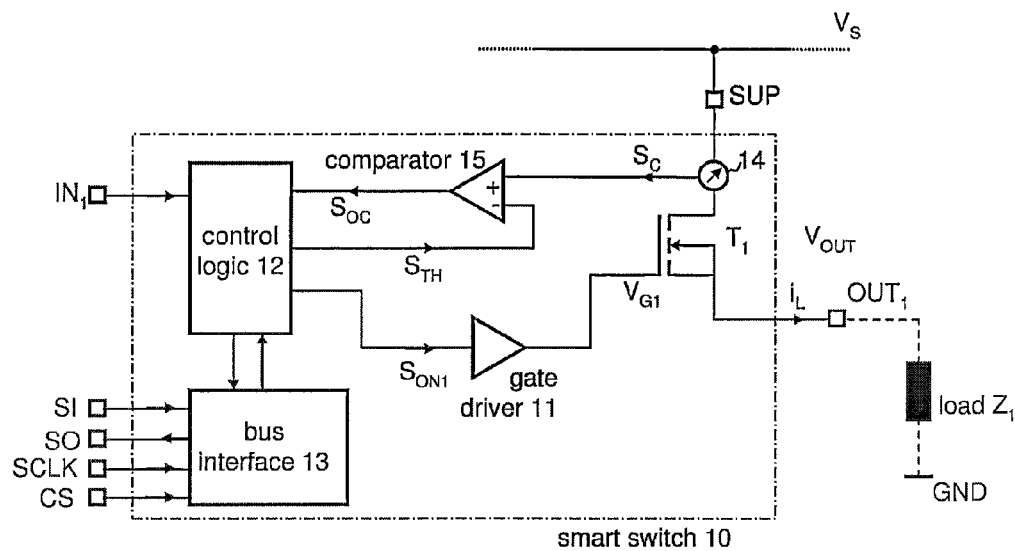
FIG. 1 illustrates the basic structure of a smart switch including an over-current protection.

FIG. 1 illustrates the basic structure of a so-called smart switch 10. It should be noted that the illustration is not exhaustive as only those components are shown that are relevant for the further discussion. The smart switch usually includes one or more semiconductor chips which are arranged within one chip package. A semiconductor switch $T_1$ (e.g. a high-side n-channel DMOS transistor) is integrated in a silicon chip, wherein the load current path (i.e. the drain-source current path in case of a MOS transistor) is connected between a supply terminal SUP and an output terminal $OUT_1$. The supply terminal SUP is usually connected with a supply pin of the chip package which is supplied with a supply voltage $V_S$ via a supply line. The output terminal $OUT_1$ is usually connected with an output pin of the chip package, and an electric load $Z_1$ (e.g. a lamp) may be connected between the output pin and, e.g., ground potential GND. Smart switches may have a plurality of output channels, wherein one semiconductor switch and one corresponding output pin is provided for each channel. The examples discussed herein only show a smart switch with a single channel for the sake of a clear and simple illustration. A gate driver 11 is coupled to the control electrode of the power transistor $T_1$ (e.g. the gate electrode in case of a MOS transistor) and generates a drive signal $V_G$ (e.g. a gate current or a gate voltage) in accordance with a respective control signal $S_{ON1}$ supplied to the gate driver 11. In the present example the driver signal is appropriate to switch the power transistor $T_1$ on when the control signal $S_{ON1}$ is 1 (i.e. a high logic level) and to switch the power transistor T1 off when the control signal $S_{ON1}$ is 0 (i.e. a low logic level).

The smart switch 10 includes an over-current detector associated with the power transistor $T_1$ which is configured to detect whether the load current $i_L$ flowing through the power transistor $T_1$ exceeds a specific maximum current. In the present example the over-current detector includes a current measurement circuit 14 that is configured to provide a current measurement signal $S_C$, which represents the load current $i_L$, and a comparator 15 which receives, as input signal, the current measurement signal $S_C$ and an over-current threshold $S_{TH}$, which determines the maximum current, and which is configured to compare the input signals and to generate an over-current signal $S_{OC}$. The over-current signal is indicative of whether, or not, the current measurement signal $S_C$ is higher than the over-current threshold $S_{TH}$. The over-current signal may be a binary signal, wherein, e.g., a high logic level may indicate an over-current.

A control logic circuit 12 may be provided for controlling the switching behavior of the transistor $T_1$. The control logic receives an input signal $IN_1$ and generates the corresponding control signal $S_{ON1}$ dependent on the input signal $IN_1$ and the over current signal ($S_{OC}$). In case of a multi-channel smart switch an input signal and a respective control signal as well as an over current signal is provided for each channel. The control logic 12 may be formed using discrete logic circuit components such as timers, counters, gates, etc. Alternatively, a micro controller may be used that executes software appropriate to perform the same function. Further, the control logic 12 may be partly implemented using discrete circuit components and partly using a micro controller. The function of the control logic 12 may be implemented as a finite state machine (FSM) which is described below with reference to FIG. 2.

When the semiconductor device (the smart switch in the present example) is powered on, that is when the supply voltage $V_S$ applied to the supply terminal SUP rises above a minimum level, the finite state machine starts with state $X_0$ in which the load current $i_L$ is switched off and all timers and counters are reset to appropriate initial values. When the input signal $IN_1$ indicates that the load current $i_L$ is to be switched on, then the corresponding control signal $S_{ON1}$ is set to a logic level appropriate to switch on the transistor $T_1$ (e.g. $S_{ON1}$=1) and a timer is started (timer value $T_{ON}$). At the same time the finite state machine changes to state $X_1$ which represents the start-up phase, during which high inrush currents may occur. In this state $X_1$ the over-current threshold $S_{TH}$ is set to a first, comparably high threshold value ($S_{TH}$=$S_{HI}$). When the over-current signal $S_{OC}$ indicates an over-current, then the finite state machine changes to state $X_3$, in which an over-current counter $count_{OC}$ is incremented. When (after incrementing the over-current counter $count_{OC}$) the number of over-current events indicated by the counter $count_{OC}$ is smaller than a maximum number ($count_{OC}$<$max_{OC}$), then—after a fixed delay time (blanking time, e.g. $T_{BLANK}$=100 μs)—the finite state machine falls back to state $X_1$. Otherwise (i.e. when the maximum number of over-current events have been detected), the finite state machine changes to failure state $X_4$ and, as a result, the load current is finally switched off, e.g., by setting $S_{ON1}$=0.

During the start-up period the inrush current may trigger an over-current event several times and thus the finite state machine will toggle between the state $X_1$ and state $X_3$ unless the maximum number $max_{OC}$ of over-current events is reached (e.g. $max_{OC}$=32). If the load is an incandescent lamp, the finite state machine might toggle between states $X_1$ and $X_3$, e.g. 15 times and then remain in the state $X_1$ until the timer value $T_{ON}$ indicates that a fixed time interval defining the start-up phase is over. The finite state machine then changes to state $X_2$ and the over-current threshold $S_{TH}$ is set to a second, lower threshold value ($S_{TH}$=$S_{LO}$). This state $X_2$ represents the normal operation of the smart switch. The finite state machine will remain in this state until either the input signal $IN_1$ indicates that the load current is to be switched off (e.g. $IN_1$=0) or an over-current (using the lower threshold, however) is detected. In the first case, the finite state machine falls back to state $X_0$ (leading to a reset of all timers and counters) and, in the second case, the finite state machine changes to the failure state $X_4$ without allowing any toggling. Once in the failure state $X_4$, an external reset command or a new power-on is required to bring the state machine back to the state $X_0$.

Referring again to FIG. 1, the smart switch 10 further includes a bus interface 13 that is coupled to the control logic 12 (state machine) via communication lines for exchanging data between the control logic 12 and the bus interface 13. Generally, the bus interface 13 is configured to forward data from or to an external bus, e.g. a serial bus, such as the standardized SPI bus (serial peripheral interface bus). In the present example the bus interface 13 is a serial peripheral interface (SPI) which is connected to the external chip package pins SI, SO, SCLK, CS for connecting, for example, to an external bus master device. Serial data may be received via the SI pin (SI=serial input), whereas serial data is sent via the SO pin (SO=serial out). The serial bus communication is clocked via a clock signal received over the SCLK pin (SCLK=serial clock). Finally, the bus interface 13 may be activated and de-activated via a so-called chip select signal, which may be received via the CS pin (CS=chip select). As the serial peripheral interface is as such known, the details concerning the bus interface are not further discussed here. Any data or signal occurring within the control logic 12 may be digitized and sent to an external bus master device via the bus interface 13. It should be noted that different bus systems may have a different number of pins and may use different signals for data transmission.

Figure 3:
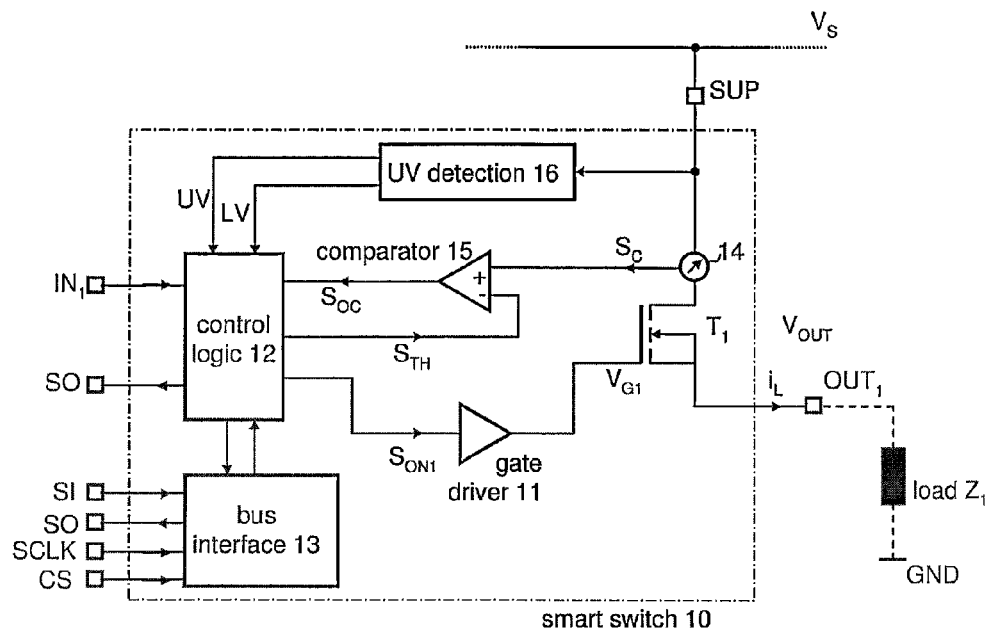
FIG. 3 illustrates another exemplary smart switch including an over-current detector and an under-voltage detector.

FIG. 3 illustrates another example of a smart switch 10 in accordance with the present invention. The smart switch 10 of FIG. 3 is identical to the example of FIG. 1 with an additional low-voltage detection circuit 16 which is coupled to the supply terminal SUP of the smart switch 10 and which is configured to compare the supply voltage $V_S$ received over the supply pin SUP with one or more voltage thresholds. For example, the under voltage detection circuit 16 may be configured to compare the supply voltage $V_S$ with an under-voltage threshold $V_{UV}$ as well as with a second threshold $V_{LV}$, which is higher than the under-voltage threshold $V_{UV}$ but lower than the nominal supply voltage level (which is, e.g., 8V). The low-voltage detection circuit 16 may be further configured to signal, whether the supply voltage $V_S$ is below the under-voltage threshold $V_{UV}$ (i.e. $V_S<V_{UV}$, in this case the under-voltage signal indicates UV=1), or whether the voltage $V_S$ is lower than the second threshold $V_{LV}$ but still higher than the under voltage threshold (i.e. $V_{UV}<V_S<V_{LV}$, in this case the low-voltage signal indicates LV=1). Thus an under-voltage event occurs when $V_S<V_{UV}$ and a low-voltage event occurs when $V_{UV}<V_S<V_{LV}$ or simply $V_S<V_{LV}$.

As mentioned in the introductory part an under-voltage may lead to a reset of the finite state machine (FSM) and thus to a reset of the counter count$_{OC}$ and the timer $T_M$ mentioned above in the context of the state machine described with reference to FIG. 2. When the under-voltage is due to a high voltage drop across the supply line, which is a result of the rising load current $i_L$ after switching on the power transistor $T_1$, then a reset caused by an under-voltage ($V_S<V_{UV}$) is triggered every time the load current is switched on. As a result, the power transistor $T_1$ may toggle on and off ad infinitum as the over-current counter count$_{OC}$ will never reach the maximum number due to the regular resets. The following examples will illustrate the problem more closely. Assuming a first, higher current threshold of $S_{HI}$=27 A, a second, lower current threshold $S_{LO}$=19 A, a resistance of the supply line of 100 mΩ and an inductance or a supply line of 5 μH, and further assuming a rise time of 50 μs and a load current swing of 25 A, then the voltage drop across the supply line will be 2.5V (25 A times 100 mΩ) due to the line resistance and another 2.5V (25 A/50 μs times 5 μH) due to the line inductance. That is, the total voltage drop across the supply line will be 5V due to the load current swing of 25 A when switching on the power transistor $T_1$, although the high current threshold of $S_{TH}$=$S_{HI}$=27 A, which is valid during the start-up phase of the load (e.g. the incandescent lamp), is not reached and so no over-current event is caused. However, when the nominal supply voltage, e.g. $V_S$=8V, is low, then the supply voltage $V_S$ applied to the supply terminal SUP may temporarily fall down to 3V (8V–5V) and thus below the under-voltage threshold $V_{UV}$ which is, in the present example, about 3.5V.

One can see that, in the present example, an under-voltage event is caused every time the power transistor $T_1$ is activated (i.e. switched on). In case of a short-circuited load the over-current detection would signal an over-current every time the transistor $T_1$ is activated. However, the low-voltage detector 16 will signal an under-voltage also every time the MOS transistor $T_1$ is activated. As the over-current counter count$_{OC}$ will be reset every time an under-voltage is detected, the counter count$_{OC}$ will never reach the maximum number max$_{OC}$ and, consequently, the smart switch may toggle on and off ad infinitum. As a result, local over-temperatures may occur in the silicon chip which may lead to a degradation of the device or even to thermal destruction. Although an over-temperature protection circuit may be provided, this over-temperature protection may not be fast enough to detect local overheating (so-called "hot spots") on the chip, and thus the over-temperature protection mechanism might be ineffective.

Figure 2:
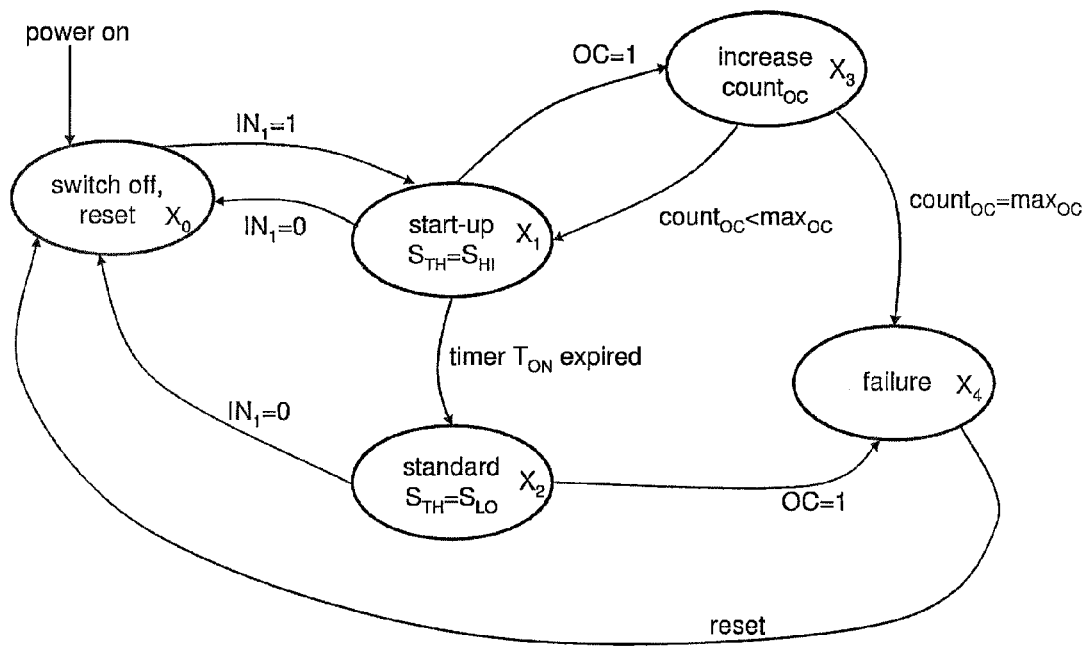
FIG. 2 illustrates a finite state machine that controls the operation of the smart switch of FIG. 1.

To solve or at least alleviate the above-mentioned problem, the control logic 12, which controls the function of the smart switch 10 illustrated in FIG. 3, has been modified as compared to the previous example (i.e. the smart switch of FIG. 1 in connection with the finite state machine shown in FIG. 2).

Figure 4:
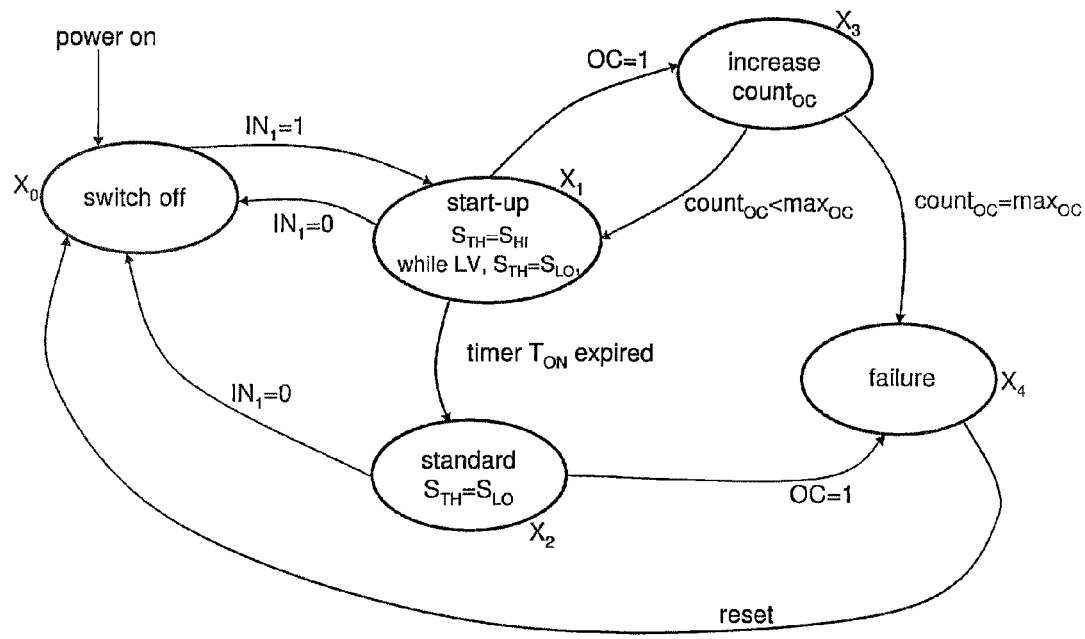
FIG. 4 illustrates a finite state machine that controls the operation of the smart switch of FIG. 3.

The state machine of FIG. 4 is essentially the same as the state machine of FIG. 2. However, the only difference is in the state $X_1$, in which an additional voltage monitoring is performed as described with reference to FIG. 3, the low-voltage detection circuit 16 is configured to monitor the supply voltage $V_S$, compare it with a second voltage threshold $V_{LV}$ which is higher than the under-voltage threshold $V_{UV}$ but lower than the nominal supply voltage $V_S$. Particularly, the second voltage threshold $V_{LV}$ is approximately the mean value of the nominal supply voltage $V_{SNOM}$ (e.g., $V_{SNOM}$=8V) and the under-voltage threshold (e.g. $V_{UV}$=3.5V, thus $V_{LV}$=5.75V). The low-voltage detection circuit 16 signals a low supply voltage when the supply voltage $V_S$ falls below the second voltage threshold $V_{LV}$, but remains above the under voltage threshold $V_{UV}$. When the low-voltage detection circuit 16 signals a low voltage, then the higher over-current threshold $S_{TH}$=$S_{HI}$ is reduced to the lower over-current threshold $S_{TH}$=$S_{LO}$ as long as the low voltage signal LV is active (LV=1). This reduces the maximum load current swing to the lower over-current threshold $S_{LO}$ (e.g., $S_{LO}$=19 A whereas $S_{HI}$=27 A), and thus the voltage drop across the supply line is limited accordingly.

Continuing with a previous example, it is assumed that the lower, second over-current threshold is about 19 A (that is about 70% of the upper threshold of 27 A). As a consequence, the maximum current-swing (which will occur when the load is short-circuited) is reduced from 27 A to 19 A and thus the voltage drop across the supply line is reduced to 1.9V due to the resistance of the supply line and to 1.9V due to the inductance of the supply line, that is, a total voltage drop of 3.8V (instead of 5V in the previous case). Consequently, assuming a minimum nominal supply voltage of $V_{SNOM}$=8V, the supply voltage will not fall below 4.2V (8V–3.8V) and thus an under-voltage event ($V_S<V_{UV}$, UV=1) is not caused (as $V_{UV}$=3.5V). When the low-voltage detection circuit 16 indicates that the supply voltage is again above the second voltage threshold $V_{LV}$, then the over-current threshold $S_{TH}$ may be switched back to the higher current threshold $S_{TH}=S_{HI}$ again.

Using the state machine of FIG. 4 for controlling the smart switch 10 of FIG. 3 might result in a higher number of detected over-current events during the start-up phase of a load, but it will, however, prevent undesired under-voltage events due to transient voltage swings at the supply lines resulting from the deep current gradient. By avoiding the undesired under-voltage events, an unintentional reset of the counter count$_{OC}$ that counts the detected over-current events will be avoided, too.

Figure 5:
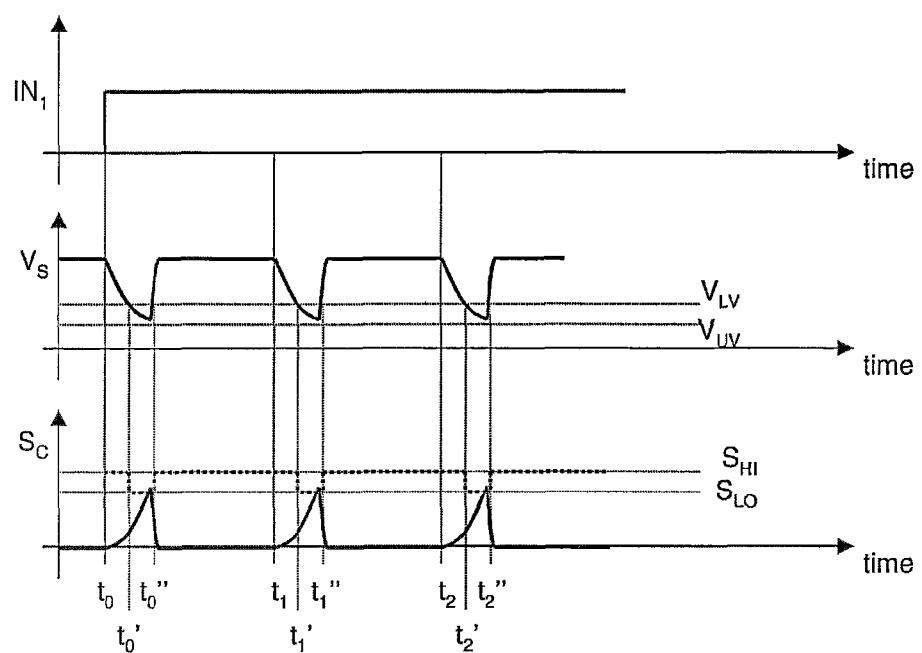
FIG. 5 illustrates a timing diagram illustrating the relevant signals occurring in the smart switch of FIG. 3.

FIG. 5 includes three timing diagrams illustrating the waveforms of the input signal $IN_1$ (top timing diagram), the supply voltage applied to the supply pin SUP (middle timing diagram), and the corresponding measured load current signal $S_C$ (bottom diagram). The diagrams illustrate the signal waveforms for a start-up phase of a load such as an incandescent lamp.

Referring to the top diagram of FIG. 5, the input signal $IN_1$ is switched from an initially low logic level (0V) to a high logic level (5V) at a time instant denoted as time $t_0$. At this time instant, the state machine of FIG. 3 will change from the initial state $X_0$ to state $X_1$, setting the control signal $S_{ON1}$ to a high level ($S_{ON1}$=1), which causes the gate driver 11 to generate a drive signal $V_{G1}$ that activates the semiconductor switch $T_1$. In state $X_1$ the "default" over-current threshold is $S_{HI}$ ($S_{TH}=S_{HI}$). As a consequence, the load current $i_L$ (and thus the measured load current signal $S_C$) will steeply rise, while the supply voltage $V_S$ will correspondingly drop. At the time instant denoted as $t_0'$ the supply voltage $V_S$ drops below the low-voltage threshold $V_{LV}$ (see middle diagram of FIG. 5). As a consequence, the over-current threshold $S_{TH}$ is set to the lower value ($S_{TH}=S_{LO}$) as discussed above. A short time later, at a time instant $t_0''$, the load current signal $S_C$ exceeds the over-current threshold $S_{TH}=S_{LO}$ which causes an over-current event that is detected by the over-current detector (composed of the current measurement circuit 14 and the comparator 15) and signaled to the control logic circuit 12 (i.e. to the state machine) by setting the over-current signal OC to a high logic level (OC=1). This triggers a state switch of the state machine which changes from state $X_1$ to state $X_3$. In the state $X_3$ the control signal $S_{ON1}$ is blanked to (temporarily) switch off the transistor $T_1$, which causes the load current flow to stop immediately and the supply voltage recovers to the nominal value. Further, the over-current event counter count$_{OC}$ is incremented and, as the counter has not yet reached max$_{OC}$, the state machine falls back to state $X_1$ after a short delay time (blanking time $T_{BLANK}$) of, for example 100 μs. Back in state $X_1$ the transistor is re-activated as $IN_1$ is still at a high level. The mentioned delay time (blanking time $T_{BLANK}$) is about $t_1-t_0''$.

At the time $t_1$ the cycle starts over. The state machine will toggle between state $X_0$ and $X_3$ until either the counter count$_{OC}$ reaches max$_{OC}$ (e.g. max$_{OC}$=32), which would cause the state machine to change to the failure state $X_4$, or the load current gradually decreases so that no further over-current events are caused. In this case, the state machine would change to state $X_2$ and remain there (unless another over-current event occurs) until a switch-off of the transistor is initiated by a low input signal $IN_1$ ($IN_1$=0).

Below some important general aspects of the above-described exemplary embodiments are summarized. However, the following is not regarded to be complete or exhaustive. Accordingly, the semiconductor device described herein may include a semiconductor chip with an integrated power transistor $T_1$ which has a load current path operable to carry, in accordance with an input signal, a load current. The transistor $T_1$ is coupled between a supply terminal SUP to be supplied with a supply voltage $V_S$ and an output circuit node $OUT_1$. Thus, the load current $i_L$ can flow from the supply terminal SUP to the output circuit node $OUT_1$. The device further includes a voltage comparator 16 that is configured to compare the supply voltage $V_S$ with a voltage threshold $V_{LV}$ and to signal a low supply voltage (e.g. by setting a flag LV=1) when the supply voltage $V_S$ reaches or falls below the voltage threshold $V_{LV}$. Furthermore, an over-current detector is coupled to the transistor $T_1$ and configured to compare (comparator 15) a load current signal $S_C$ (current measurement circuit 14) that represents the load current with an over-current threshold $S_{TH}$ and to signal an over-current (e.g. by setting a flag OC=1) when the load current signal SC reaches or exceeds the over-current threshold $S_{TH}$, e.g. when $S_C \geq S_{TH}$. A control logic unit 12 is configured to deactivate the transistor $T_1$ (e.g. via the gate driver 11) and thus the load current flow when an over-current is signalled. The control logic circuit 12 can further reduce the over-current threshold $S_{TH}$ from a (first) higher value $S_{HI}$ to a (second) lower value $S_{LO}$ when and as long as the voltage comparator 16 signals a low supply voltage (LV=1). As explained above, the reduction of the over-current threshold $S_{TH}$ when the supply voltage is already low (due to the voltage drop across the supply lines) prevents the supply voltage from dropping below an under-voltage limit, which would cause a complete reset of the logic circuitry of the device.

The control logic circuit 12 may be operable in a first mode (start-up phase) and a second mode (normal operation). The mentioned reduction reduce of the over-current threshold $S_{TH}$ from the first value $S_{HI}$ to the second value $S_{LO}$ is done in the first mode (i.e. during the start-up phase), whereas the over-current threshold $S_{TH}$ is generally set to the lower value SLO in the second mode (i.e. during normal operation). Furthermore, in the first mode the load current flow is deactivated by the control logic circuit 12 when an over-current is signalled (OC=1) and, furthermore, reactivated after a blanking time $T_{BLANK}$ unless a maximum number max$_{OC}$ of over-current events have been signalled.

The control logic changes from the first mode (start-up phase) to the second mode (normal operation) after a start-up time $T_{ON}$ has elapsed. In the second mode, the control logic unit may be configured to set the over-current threshold $S_{TH}$ to a third value that is lower than the higher first value $S_{HI}$ or equal to the lower second value $S_{LO}$. In the second mode the load current flow is deactivated when an over-current is signalled without performing any "retries", i.e. without prior re-activation. Thus, the load current is maintained inactive until a reset signal is received.

The voltage comparator 16 may be further configured to compare the supply voltage $V_S$ with a further voltage threshold $V_{UV}$, which corresponds to a minimum supply voltage that is required for operating the device. An under-voltage is signalled (e.g. by setting a flag UV=1) when the supply voltage ($V_S$) reaches or falls below the minimum supply voltage $V_{UV}$. Generally, the voltage threshold $V_{LV}$ may be chosen higher than the minimum supply voltage $V_{UV}$ but lower than a nominal supply voltage of the device.

The control logic circuit 12 may include a counter count$_{OC}$ that is configured to count the number of times an over-current is signalled. The counter count$_{OC}$ is reset while the input signal $IN_1$ indicates that the load current is inactive ($IN_1$=0) or in response to a transition in the input signal $IN_1$ indicating to activate the load current. Furthermore, the control logic circuit 12 may include a timer configured to measure the start-up time $T_{ON}$, the timer being reset while the input signal $IN_1$ indicates that the load current is inactive or in response to a transition in the input signal $IN_1$ indicating to activate the load current.

Generally, a serial bus interface 13 may be coupled to the control logic circuit 12 and configured to enable a data exchange between the control logic circuit 12 and an external device, for example an external controller. Particularly the mentioned reset command may be received via the serial bus. Also the input signal $IN_1$ could be transferred via the serial bus.

Another aspect of the invention relates to a method for controlling the power semiconductor transistor $T_1$ to activate or inactivate a load current $i_L$ passing through the transistor $T_1$ from a supply terminal SUP providing a supply voltage $V_S$ to an output circuit node $OUT_1$. The method may include monitoring the supply voltage $V_S$ and signalling a low supply voltage (e.g. by setting the flag LV=1) when the supply voltage $V_S$ reaches or falls below a first voltage threshold (i.e. when $V_S \leq_{LV}$). The method may further include monitoring the load current $i_L$ and signalling an over-current (e.g. by setting the flag OC=1) when the load current reaches or exceeds an adjustable over-current threshold. The over-current threshold $S_{TH}$ is reduced from an from an initially higher first value $S_{HI}$ to a lower second value $S_{LO}$ when and as long as a low supply voltage is signalled (LV=1). The transistor and thus the load current passing through the transistor is at least temporarily deactivated when an over-current is signalled.

Although various exemplary embodiments have been disclosed, it will be apparent to those skilled in the art that changes and modifications can be made according to a specific implementation of the various embodiments and without departing from the spirit and scope of the invention. It will be obvious to those reasonably skilled in the art that other components performing the same functions may be suitably substituted. Particularly, signal processing functions may be performed either in the time domain or in the frequency domain while achieving substantially equal results. It should be mentioned that features explained with reference to a specific figure may be combined with features of other figures, even where not explicitly mentioned. Further, the methods of the invention may be achieved in either all software implementations, using the appropriate processor instructions, or in hybrid implementations that utilize a combination of hardware logic and software logic to achieve the same results. Such modifications to the concept are intended to be covered by the appended claims.

What is claimed is:

1. A semiconductor device, comprising:
    a semiconductor chip including a load current path operable to carry a load current from a supply terminal having a supply voltage to an output circuit node in accordance with an input signal;
    a voltage comparator coupled to the supply terminal and configured to compare the supply voltage with a voltage threshold and to signal a low supply voltage when the supply voltage reaches or falls below the voltage threshold;
    an over-current detector coupled to the load current path and configured to compare a load current signal that represents the load current with an over-current threshold and to signal an over-current when the load current signal reaches or exceeds the over-current threshold; and
    a control logic unit configured to deactivate the load current flow when an over-current is signalled and further configured to reduce the over-current threshold from a higher first value to a lower second value as long as the voltage comparator signals a low supply voltage.

2. The semiconductor device of claim 1, wherein the control logic unit is operable in a first mode and a second mode, and
    wherein, in the first mode, the control logic unit is configured to reduce the over-current threshold from a higher first value to a lower second value as long as the voltage comparator signals a low supply voltage, to deactivate the load current flow when an over-current is signalled, and further to reactivate the load current flow after a blanking time unless a maximum number of over-current events have been signalled.

3. The semiconductor device of claim 1, wherein the control logic unit is configured to change from the first mode in the second mode after a start-up time has elapsed and wherein
    wherein, in the second mode, the control logic unit is configured to set the over-current threshold to a third value that is lower than the higher first value or equal to the lower second value, and further to deactivate the load current flow when an over-current is signalled.

4. The semiconductor device of claim 3, wherein, in the second mode of operation, the control logic unit is configured to finally deactivate the load current flow when an over-current is signalled without prior re-activation and to maintain the load current inactive until a reset signal is received.

5. The semiconductor device of claim 1, wherein the voltage comparator is further configured to compare the supply voltage with a further voltage threshold, which corresponds to a minimum supply voltage that is required for operating the device, and to signal an under-voltage when the supply voltage reaches or falls below the minimum supply voltage, the voltage threshold being higher than the minimum supply voltage but lower than a nominal supply voltage of the device.

6. The semiconductor device of claim 2, wherein the control logic unit includes a counter configured to count the number of times an over-current is signalled by the over-current detector, the counter being reset in response to a transition in the input signal indicating to activate the load current.

7. The semiconductor device of claim 3, wherein the control logic unit includes a timer configured to measure the start-up time, the timer being reset in response to a transition in the input signal indicating to activate the load current.

8. The semiconductor device of claim 1, further including a serial bus interface coupled to the control logic circuit and configured to enable a data exchange between the control logic circuit and an external device.

9. The semiconductor device of claim 1, further including a power semiconductor transistor that is configured to activate and inactivate the load current flow from the supply terminal to a respective output terminal in accordance with the input signal.

10. A method for controlling a power semiconductor transistor to activate or inactivate a load current passing through the transistor from a supply terminal providing a supply voltage and an output terminal, the method comprising:
    monitoring the supply voltage and signalling a low supply voltage when the supply voltage reaches or falls below a first voltage threshold;
    monitoring the load current and signalling an over-current when the load current reaches or exceeds an adjustable over-current threshold;
    reducing the over-current threshold from an initially higher first value to a lower second value when and as long as a low supply voltage is signalled; and at least temporarily deactivating the transistor and thus the load current passing through the transistor when an over-current is signalled.

11. The method of claim 10, further comprising:
monitoring the input signal and measuring a time starting from a transition in the input signal that indicates that the load current is to be activated; and
signalling when the measured time exceeds a pre-defined start-up time.

12. The method of claim 11, further comprising after the deactivation the transistor and if the measured time does not exceed the start-up time:
counting how often an over-current has been signalled;
reactivating the deactivated transistor and thus the load current passing through the transistor unless the counted number of over-current events exceeds a maximum number;
waiting until a reset signal is received when the counted number of over-current events has reached a maximum number before allowing a re-activation of the transistor.

13. The method of claim 11, further comprising after the deactivation the transistor and if the measured time has exceeded the start-up time:
waiting until a reset signal is received when the counted number of over-current events has reached a maximum number before allowing a re-activation of the transistor.

14. The method of claim 10, further comprising:
monitoring a binary input signal and activating and deactivating the load current dependent on a logic level of the input signal,
wherein a counter counting the number of over-current events and a timer measuring the start-up time are reset while the input signal indicates that the load current is to be inactive.

15. The method of claim 12, wherein the reset signal is received via a serial bus interface from an external device.

16. A method, comprising:
signalling a low supply voltage when a supply voltage reaches or falls below a first voltage threshold;
monitoring a load current and signalling an over-current when the load current reaches or exceeds an adjustable over-current threshold;
reducing the over-current threshold from a higher first value to a lower second value when and as long as a low supply voltage is signalled; and
at least temporarily deactivating a transistor when an over-current is signalled.

17. The method of claim 16, further comprising:
counting how often an over-current has been signalled;
reactivating the deactivated transistor and thus the load current passing through the transistor a delayed time after the deactivation unless the counted number of over-current events exceeds a maximum number;
waiting until a reset signal is received when the counted number of over-current events has reached a maximum number before allowing a re-activation of the transistor.

18. The method of claim 16, further comprising:
monitoring a binary input signal and activating and deactivating the load current dependent on a logic level of the input signal,
wherein a counter counting the number of over-current events and a timer measuring the start-up time are reset while the input signal indicates that the load current is to be inactive.

19. A semiconductor device, comprising:
a semiconductor chip including an associated load current and supply voltage;
a voltage comparator configured to compare the supply voltage with a voltage threshold and to signal a low supply voltage when the supply voltage reaches or falls below the voltage threshold;
an over-current detector configured to compare the load current with an over-current threshold and to signal an over-current when the load current reaches or exceeds the over-current threshold; and
a control logic unit configured to deactivate the load current when an over-current is signalled and further configured to reduce the over-current threshold from a first value to a second value as long as the voltage comparator signals a low supply voltage.

20. The semiconductor device of claim 19, wherein the over-current detector is configured to compare a load current signal that represents the load current with the over-current threshold and to signal the over-current when the load current signal reaches or exceeds the over-current threshold.

* * * * *